(12) United States Patent
Choi

(10) Patent No.: US 6,376,823 B1
(45) Date of Patent: Apr. 23, 2002

(54) CCD IMAGE SENSOR

(75) Inventor: Sun Choi, Kyonggi-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/715,262

(22) Filed: Nov. 20, 2000

(30) Foreign Application Priority Data

Mar. 28, 2000 (KR) .............................................. 00-15822

(51) Int. Cl.[7] .............................................. H01L 27/148
(52) U.S. Cl. .................................. 250/208.1; 250/214 R
(58) Field of Search .......................... 250/208.1, 214 R, 250/214 A, 214 C; 348/294, 302, 303, 306, 308, 311, 314

(56) References Cited

U.S. PATENT DOCUMENTS 3,786,263 A * 1/1974 Michon ....................... 348/306
5,371,351 A * 12/1994 Van Berkel .............. 250/208.1

OTHER PUBLICATIONS

Duvvury, et al., EOS/ESD Symposium vol. 95, pp. 4.1.1–4.1.13.

* cited by examiner

*Primary Examiner*—John R. Lee
(74) *Attorney, Agent, or Firm*—Birch, Stewart, Kolasch & Birch, LLP

(57) ABSTRACT

A CCD image sensor comprising a VDD terminal, a reset gate for controlling a voltage into which are converted into the VDD terminal, and a bypass portion for bypassing charges branched between the reset gate and the VDD terminal and charged by a CDM.

9 Claims, 2 Drawing Sheets

CCD IMAGE SENSOR

BACKGROUND OF THE INVENTION

1. Field of the Invention

The present invention relates to an image sensor, and more particularly, to a charged coupled device (CCD) image sensor which improves Charge Device Model (CDM) characteristic between a reset gate of a CCD and a VDD terminal.

2. Background of the Related Art

Generally, high packing density and low power of a semiconductor device including an image sensor are required to improve reliability of the semiconductor device. By contrast, an Electro Static Discharge (ESD) lowers the reliability of the semiconductor. A Human Body Model (HBM), a Machine Model (MM), and a Charged Device Model (CDM) are known as an ESD model until now. The HBM is the ESD model generated by a human, the MM is the ESD model generated by an equipment, and the CDM is the ESD model generated due to (+)/(−) charges of a package during a fabricating process of the product.

Typically, an ESD level is determined by elements such as a ESD protecting circuit, a layout, and a fabricating process. Recently, it is noted that the low power reduces the thickness of a gate oxide film. This is susceptible to the ESD. The CDM has lately attracted considerable attention. The CDM directly acts on yield of the product because a chip is destroyed by the charged state during the fabricating process. Thus, it is very important to optimize the CDM characteristic so as to improve reliability of the product.

A related art CCD image sensor will be described with reference to the accompanying appended drawing.

FIG. 1 is an equivalent circuit of a reset gate and a VDD terminal according to the related art CCD image sensor.

As shown in FIG. 1, the related art CCD image sensor includes a reset gate 11, a VDD terminal 12, a first input resistor 13 connected to the reset gate 11, a second input resistor 14 connected to the VDD terminal 12, a first poly resistor 15 and a second poly resistor 16 serially connected to each input resistor, a capacitor 17 serially connected between the first poly resistor 15 and the second poly resistor 16, a first ESD protecting circuit 18 formed between a ground terminal (GND) and a branched point which is between the reset gate 11 and the first input resistor 13, and a second ESD protecting circuit 19 formed between the GND and a branched point which is between the VDD terminal 12 and the second input resistor 14.

The capacitor 17 has a very small capacitance of 20 fF and cannot increase its capacitance any more due to a design rule.

The first and second input resistors 13 and 14 have 25Ω, respectively. The first poly resistor 15 has 1 KΩ and the second poly resistor 16 has 200Ω.

Generally, in case of the CCD image sensor, charges generated at a pixel are converted into a voltage through a floating diffusion(FD) region by a source follower, and discharged through the VDD terminal 12. An on/off device responsible for the discharge is the reset gate 11 and the size of the device is very small due to its characteristic. For this reason, a capacitance value of a reset transistor(formed by a reset gate and source/drain both sides of the reset gate) is necessarily small.

Accordingly, when a chip has charges caused by friction and contacts a material of low potential, charges in the chip are instantaneously discharged so that the chip is damaged.

That is, when the reset gate 11 or the VDD terminal 12 is connected to the GND, the charges caused by friction are discharged through the capacitor 17 so that break-down of a dielectric film of the reset gate is caused.

The CDM characteristic between the reset gate and the VDD terminal according to the related art, causes breakdown of the dielectric film of the reset gate at 400V.

The related art CCD image sensor has several problems.

When the reset gate or the VDD terminal is connected to the GND, the charges caused by friction are discharged through the capacitor, thereby causing break-down of the dielectric film of the reset gate. The break-down deteriorates CDM characteristic of the ESD. That is, errors of CDM pulse, such as break-down of the dielectric, are generated by a pulse rising time and a current peak value. The current peak value occurs during the pulse rising time.

Accordingly, it is necessary to increase the pulse rising time and reduce the current peak value to prevent the break-down of the dielectric film. To this end, (Resistance× capacitance) value also should be very large, but the value is limited due to characteristic of the device. Therefore, a proper protecting circuit should be provided. This results in increasing the chip size as a whole.

Also, a discharging path should be provided as much as possible. However, since there is no direct discharging path between the reset gate and the VDD terminal, a poor reset gate is caused.

SUMMARY OF THE INVENTION

Accordingly, the present invention is directed to a CCD image sensor that substantially obviates one or more of the problems due to limitations and disadvantages of the related art.

An object of the present invention is to provide a CCD image sensor which improves CDM characteristics by forming a direct discharging path between the reset gate and the VDD terminal.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a CCD image sensor according to the present invention includes a VDD terminal, a reset gate for controlling a voltage, which is converted from charges generated in a pixel, to be discharged into the VDD terminal, and a bypass portion for bypassing charges branched between the reset gate and the VDD terminal and charged by a CDM.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A CCD image sensor of the present invention is intended that a discharging path is formed between the reset gate and the VDD terminal to bypass charges caused by friction, so that the charges are discharged through the discharging path not a capacitor.

The CCD image sensor of the present invention is also intended that a poly resistance value of the VDD terminal is increased to increase a capacitance.

The CCD image sensor according to the present invention will be described with reference to FIG. 2.

Figure 1:
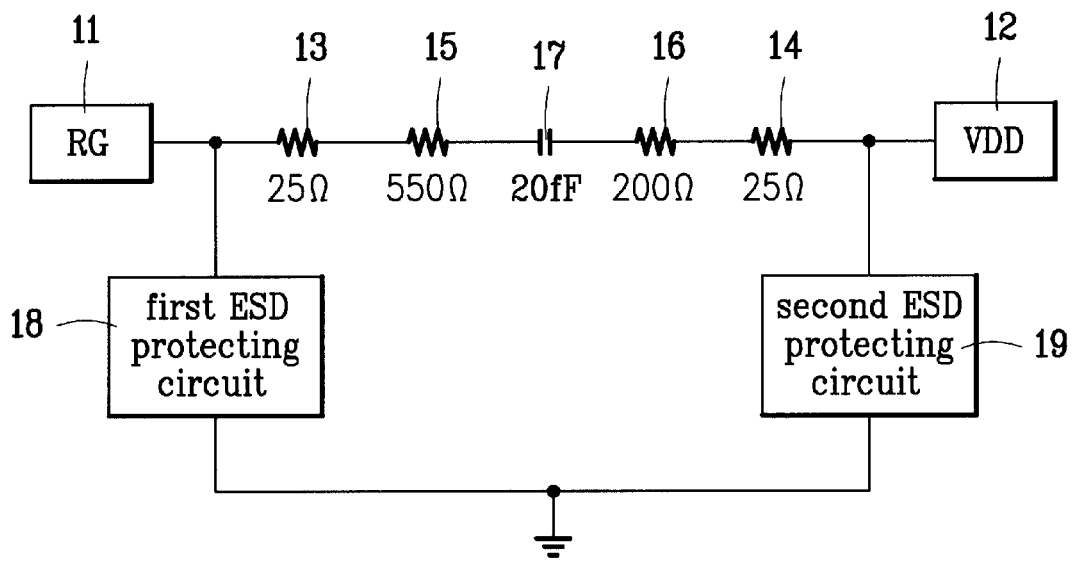
FIG. 1 is an equivalent circuit diagram between a reset gate and a VDD terminal according to the related art CCD image sensor.
Figure 2:
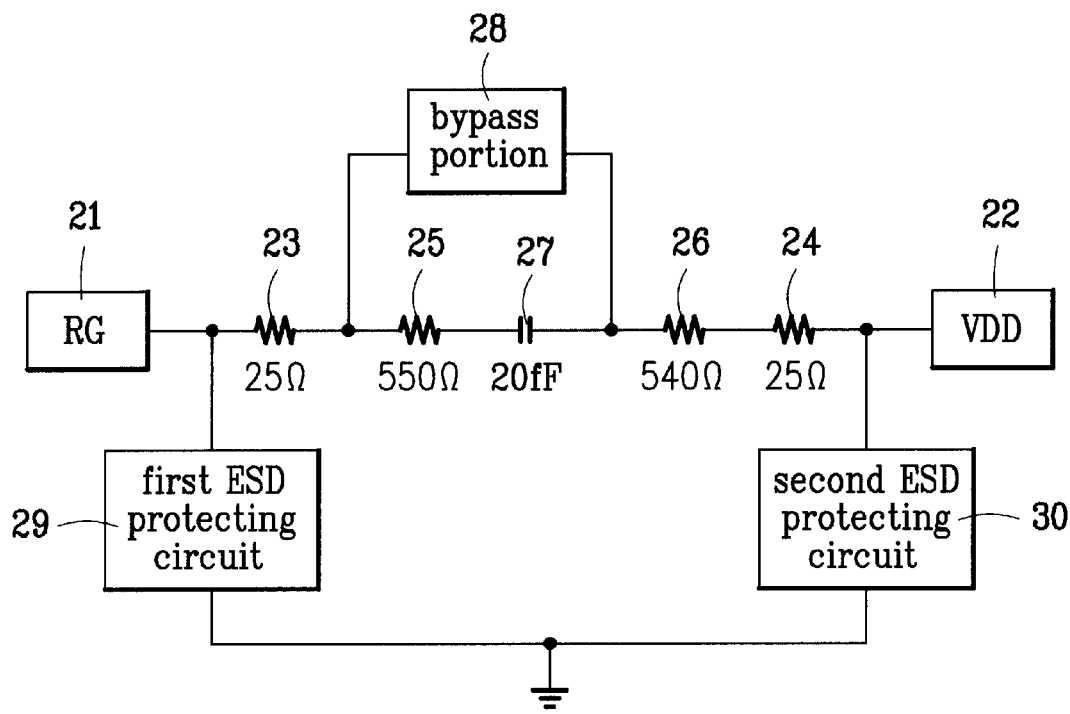
FIG. 2 is an equivalent circuit diagram between a reset gate and a VDD terminal according to the CCD image sensor of the present invention.
Figure 3:
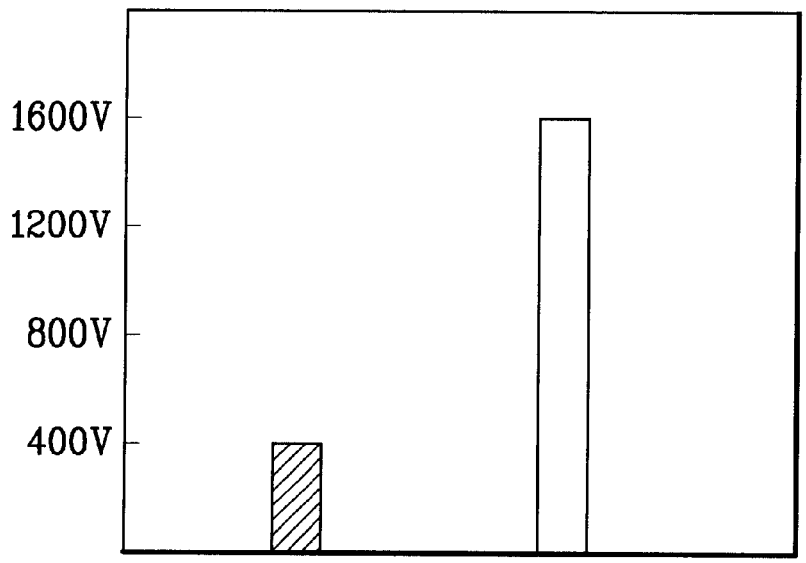
FIG. 3 is a comparative graph showing CDM characteristics between a reset gate and a VDD terminal of the related art and the present invention.

As shown in FIG. 2, the CCD image sensor includes a reset gate 21, a first resistor 23 serially connected to the reset gate 21, a VDD terminal 22, a second resistor 24 serially connected to the VDD terminal 22, a third resistor 25 serially connected to the first resistor 23, a forth resistor 26 serially connected to the second resistor 24, a capacitor 27 connected between the third resistor 25 and the forth resistor 26, a bypass portion 28 for preventing charges branched from the third resistor 25 and the forth resistor 26 and charged by friction from inputting into the capacitor 27, a first ESD protecting circuit 29 formed between a GND and a branched point which is between the reset gate 21 and the first resistor 23, and a second ESD protecting circuit 30 formed between the GND and a branched point which is between the VDD terminal 22 and the second resistor 24.

The bypass portion 28 is formed of one of a field oxide device, a MOS transistor, and a bipolar transistor.

The first and second resistors 23 and 24 have 25Ω, respectively. The third resistor 25 has 550Ω, and the forth resistor 26 has 500Ω or more above, and preferably, 540Ω.

In the related art, the forth resistor has a low value of 200Ω. However, in the present invention, the forth resistor 26 of the VDD terminal 22, has an increased value of 540Ω so as to improve CDM characteristic. The third and forth resistors 25 and 26 are a poly resistor or a diffusion resistor.

According to the present invention, when the reset gate or the VDD terminal is connected to the GND in a state that the chip is charged by CDM, the charges in the chip are discharged through the discharging path and the bypass portion.

That is, in the related art, the charges in the chip are discharged through the capacitor. However, in the present invention, the charges are discharged through the bypass portion 28.

The forth resistor 26 of the VDD terminal 22 having the poor CDM characteristic has increased value so as to increase a (resistance×capacitance) value.

This will be described in detail as follows.

When or after the chip is charged by the CDM, the charges remain in the chip. In this case, a current peak value, which is generated when the charges are discharged, is increased and a pulse rising time is shortened.

The high current peak value and the short pulse rising time mean that the discharge instantaneously occurs. Because the instantaneous discharge seriously damages an inner circuit between the reset gate 21 and the VDD terminal 22, it is important to lower the current peak value and extend the pulse rising time.

Accordingly, the current peak value is lowered and the pulse rising time is increased by the forth resistor 26, and the bypass portion 28. This prevents inner circuit from being damaged.

Because the discharging path directly discharges the charges caused between the reset gate 21 and the VDD terminal 22, the charges are transferred into the bypass portion 28 through the discharging path without passing through the capacitor, thereby protecting the capacitor.

The CDM characteristic between the reset gate and the VDD terminal according to the present invention causes break-down of the dielectric film of the reset gate at 1600V. This means that the CDM characteristic has been remarkably improved as compared to the related art in which break-down of the dielectric film of the reset gate occurs at 400V.

As described above, the CCD image sensor according to the present invention has the following advantages.

When or after the chip is charged, the charges in the chip are discharged. At this time, the current peak value is lowered and the pulse rising time is increased, thereby preventing the inner circuit between the reset gate and the VDD terminal from being damaged.

The bypass portion is formed between the reset gate and the VDD terminal to be acted as a direct discharging path. Thus, the charges are discharged through the bypass portion not the capacitor, thereby protecting the capacitor.

It will be apparent to those skilled in the art that various modifications and variations can be made in the CCD image sensor according to the present invention without departing from the spirit or scope of the invention. Thus, it is intended that the present invention covers the modifications and variations of the invention provided they come within the scope of the appended claims and their equivalents.

What is claimed is:

1. A CCD image sensor comprising:
    a VDD terminal;
    a reset gate for controlling a voltage, which is converted from charges generated in a pixel, to be discharged into the VDD terminal; and,
    a bypass portion for bypassing charges branched between the reset gate and the VDD terminal and charged by a CDM.

2. The CCD image sensor as claimed in claim 1, wherein the bypass portion is formed of one of a field oxide device, a MOS transistor, and a bipolar transistor.

3. The CCD image sensor as claimed in claim 1, further comprising a first resistor serially connected to the reset gate, a second resistor serially connected to the VDD terminal, a third resistor serially connected to the first resistor, a forth resistor serially connected to the second resistor, a capacitor connected between the third resistor and the forth resistor, a first ESD protecting circuit formed between a GND and a branched point which is between the reset gate and the first resistor, and a second ESD protecting circuit formed between the GND and a branched point which is between the VDD terminal and the second resistor.

4. The CCD image sensor as claimed in claim 3, wherein the forth resistor has 500Ω or more above.

5. The CCD image sensor as claimed in claim 3, wherein the forth resistor is a poly resistor or a diffusion resistor.

6. A CCD image sensor comprising;

a VDD terminal;

a reset gate for controlling a voltage into which are converted into the VDD terminal, a first resistor and a second resistor serially connected to the reset gate, and the VDD terminal;

a third resistor and a forth resistor respectively connected to the first resistor and the second resistor, a capacitor connected between the third resistor and the forth resistor, a bypass portion for preventing charges branched from the third resistor and the forth resistor and charged by friction from inputting into the capacitor;

a first ESD protecting circuit formed between a GND and a branched point which is between the reset gate and the first resistor; and, a second ESD protecting circuit formed between the GND and a branched point which is between the VDD terminal and the second resistor.

7. The CCD image sensor as claimed in claim 6, wherein the bypass portion is formed of one of a field oxide device, a MOS transistor, and a bypolar transistor.

8. The CCD image sensor as claimed in claim 7, wherein the forth resistor has 500Ω or more above.

9. The CCD image sensor as claimed in claim 7, wherein the forth resistor is a poly resistor or a diffusion resistor.

* * * * *